(12) United States Patent
Xianyu et al.

(10) Patent No.: US 8,097,499 B2
(45) Date of Patent: Jan. 17, 2012

(54) SEMICONDUCTOR DEVICE AND METHODS THEREOF

(75) Inventors: Wenxu Xianyu, Suwon-si (KR); Young-soo Park, Suwon-si (KR); Jun-ho Lee, Seoul (KR); Hyuk Lim, Seoul (KR); Hans S. Cho, Seoul (KR); Huaxiang Yin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 560 days.

(21) Appl. No.: 11/702,624

(22) Filed: Feb. 6, 2007

(65) Prior Publication Data

US 2007/0246802 A1   Oct. 25, 2007

(30) Foreign Application Priority Data

Apr. 25, 2006  (KR) .................. 10-2006-0037219

(51) Int. Cl.
*H01L 21/00* (2006.01)
*H01L 21/84* (2006.01)

(52) U.S. Cl. ........ 438/150; 438/149; 438/308; 438/478; 257/E33.023; 257/65; 257/66; 257/67

(58) Field of Classification Search .......... 438/149–151, 438/166, 308, 486, 487; 257/64–67, 69, 257/70, E33.023
See application file for complete search history.

(56) References Cited

U.S. PATENT DOCUMENTS

| | | | | |
|---|---|---|---|---|
| 4,511,816 A | * | 4/1985 | Mikoshiba et al. | ....... 310/313 A |
| 5,583,369 A | * | 12/1996 | Yamazaki et al. | ............ 257/635 |
| 7,662,678 B2 | * | 2/2010 | Xianyu et al. | ................. 438/150 |
| 2002/0037599 A1 | * | 3/2002 | Ishida et al. | .................... 438/29 |
| 2003/0210722 A1 | * | 11/2003 | Arakida et al. | ................. 372/49 |
| 2006/0292313 A1 | * | 12/2006 | Xianyu et al. | ................. 428/1.1 |

FOREIGN PATENT DOCUMENTS

JP     2004051446 A  *  2/2004

OTHER PUBLICATIONS

Wittkower, "Smart-Cut Technology for SOI: A new high volume application for ion implantation", 2000, IEEE pp. 269-272.*
Kemmer et al., "Epitaxy—a new technology for fabrication of advanced silicon radiation detectors", 2005, Nuclear Instruments and Methods in Physics Research A, 544, pp. 612-619.*
Ishida et al., "Double SOI Structures and Devices Applications with Heteroepitaxial $Al^2O^3$ and Si" Jpn. J. Appl. Phys., vol. 34 (1995), pp. 831-835, Part 1, No. 2B.

(Continued)

*Primary Examiner* — Alexander Ghyka
*Assistant Examiner* — Leonard Chang
(74) *Attorney, Agent, or Firm* — Harness, Dickey & Pierce, P.L.C.

(57) ABSTRACT

A semiconductor device and method thereof. The example method may include forming a semiconductor device, including forming a first layer on a substrate, the first layer including aluminum nitride (AlN), forming a second layer by oxidizing a surface of the first layer and forming a third layer on the second layer, the first, second and third layers each being highly oriented with respect to one of a plurality crystallographic planes. The example semiconductor device may include a substrate including a first layer, the first layer including aluminum nitride (AlN), a second layer formed by oxidizing a surface of the first layer and a third layer formed on the second layer, the first, second and third layers each being highly oriented with respect to one of a plurality crystallographic planes.

25 Claims, 3 Drawing Sheets

OTHER PUBLICATIONS

European Search Report dated Jan. 5, 2010 in corresponding European Application No. 06124375.4.

Kang et al., "Synthesis of epitaxial $\gamma$-$Al_2O_3$ thin films by thermal oxidation of AlN/sapphire(0001) thin films", Appl. Phys., vol. A77, pp. 627-632 (2003).

Lin et al., "Epitaxial growth of cubic AlN films on (100) and (111) silicon by pulsed laser ablation", Appl. Phys. Lett., vol. 66, No. 16, pp. 2066-2068 (Apr. 17, 1995).

Brunet et al., "Highly textured hexagonal AlN films deposited at low temperature by reactive cathodic sputtering", Materials Science and Engineering, vol. B59, pp. 88-93 (1999).

European Search Report dated Dec. 29, 2010 in corresponding European Application No. 06124375.4.

Ishida et al., "Epitaxially Stacked Structures of Si/ Al2O3/Si for Sensor Materials," *Sensors and Actuators*, A21-A23, (1990) 267-270.

\* cited by examiner

SEMICONDUCTOR DEVICE AND METHODS THEREOF

PRIORITY STATEMENT

This application claims the benefit of Korean Patent Application No. 10-2006-0037219, filed on Apr. 25, 2006, in the Korean Intellectual Property Office, the disclosure of which is incorporated herein in its entirety by reference.

BACKGROUND OF THE INVENTION

1. Field of the Invention

Example embodiments of the present invention relate generally to a semiconductor device and methods thereof, and more particularly to a semiconductor device and a method of manufacturing the semiconductor device and also a method of forming a highly oriented silicon film.

2. Description of the Related Art

Three-dimensional semiconductor devices may have the potential of increasing a density, or number of layers, of transistors or memory layers in conventional semiconductor devices. FIG. 1 is a cross-sectional view of a conventional three-dimensional semiconductor device 10. Referring to FIG. 1, the three-dimensional semiconductor device 10 may have a structure in which insulating layers 12, 14, and 16 and silicon film layers 13 and 15 may be alternately stacked on a silicon substrate 11. A plurality of thin film transistors TR (e.g., CMOS transistors, transistors associated with memory storage, etc.) may be formed on upper surfaces of the silicon substrate 11 and the silicon film layers 13 and 15. The silicon layers 11, 13, and 15 may be electrically connected to each other through conductive plugs 17.

Referring to FIG. 1, the three-dimensional semiconductor device 10 may be manufactured by stacking the silicon film layers 13 and 15 on the insulating layers 12 and 14 may thereby be configured to have higher charge mobility. Accordingly, the silicon film layers 13 and 15 may be manufactured to be highly oriented silicon films (e.g., approximating single crystals). However, conventional processes may not be capable of epitaxially growing highly oriented silicon film on an insulating layer.

Conventionally, in order to manufacture a silicon film having higher charge mobility on an insulating layer, the silicon film may be recrystallized to approximate a single crystal silicon via a laser annealing process performed after forming amorphous silicon or polycrystalline silicon on the insulating layers 12 and 14, growing the silicon film toward lateral directions from the conductive plugs 17, or alternatively bonding an individually grown single crystal silicon film to the insulating layers 12 and 14. However, each of the above-described conventional processes for attempting to approximate single crystal-type silicon films may be performed relatively high temperatures, may consume a relatively long period of time to perform and thereby may be associated with higher manufacturing or fabrication costs. Furthermore, a resultant orientation may not be controlled precisely, and grain boundaries may be generated in a resultant product.

FIG. 2 is a cross-sectional view illustrating a conventional structure used to form a highly oriented silicon film. In particular, FIG. 2 illustrates a structure including a growing silicon layer oriented in a <100> direction (e.g., a direction coinciding with a miller index direction of <100> with respect to a crystallographic plane) on a γ(gamma)-$Al_2O_3$ layer. If an $Al_2O_3$ layer 22 is formed on a silicon substrate 21 oriented in the <100> direction, the $Al_2O_3$ layer 22 may become a γ-$Al_2O_3$ oriented in the <100> direction. If a silicon layer 23 is further epitaxially grown on the γ-$Al_2O_3$ layer 22, the silicon layer 23 may be oriented in the <100> direction. As depicted in FIG. 2, the γ-$Al_2O_3$ layers 22 and 24 and (100)-silicon layers 23 and 25 may be repeatedly stacked. The "stacking" of layers in the structure of FIG. 2 may be facilitated by the lattice mismatch between a γ-$Al_2O_3$ crystal and a (100)-silicon crystal, which may typically be maintained between 2.4 to 3.5%. However, the above-described conventional process may have difficulty controlling an orientation of the silicon substrate 21.

The conventional stacking structure shown in FIG. 2 may employed to fabricate a semiconductor device. In the conventional stacking structure of FIG. 2, as discussed above, the $Al_2O_3$ layer 22 may only be highly oriented if formed on another highly oriented layer (e.g., a silicon layer). Thus, if the $Al_2O_3$ layer 22 were to be formed on, for example, an insulating layer, the resultant $Al_2O_3$ layer 22 may not be highly oriented. Accordingly, the conventional stacking structure of FIG. 2 may typically not be deployed during a fabrication of semiconductor devices.

SUMMARY OF THE INVENTION

An example embodiment of the present invention is directed to a method of forming a semiconductor device, including forming a first layer on a substrates, the first layer including aluminum nitride (AlN), forming a second layer by oxidizing a surface of the first layer and forming a third layer on the second layer, the first, second and third layers each being highly oriented with respect to one of a plurality crystallographic planes.

Another example embodiment of the present invention is directed to a semiconductor device, including a substrate including a first layer, the first layer including aluminum nitride (AlN), a second layer formed by oxidizing a surface of the first layer and a third layer formed on the second layer, the first, second and third layers each being highly oriented with respect to one of a plurality crystallographic planes.

Another example embodiment of the present invention is directed to a method of forming a highly oriented silicon film, including forming an aluminum nitride (AlN) layer on a substrate, oxidizing a surface of the AlN layer to form an Al2O3 layer, the Al2O3 layer being highly oriented with respect to one of a plurality of crystallographic planes and growing a highly oriented silicon layer on the Al2O3 layer.

Other example embodiments of the present invention are directed to a method of forming a highly oriented silicon film. In an example, the method may be performed at lower temperatures, and may be compatible with conventional semiconductor manufacturing processes, such that an orientation of the silicon film may be more effectively controlled.

Other example embodiments of the present invention are directed to a method of manufacturing a three-dimensional semiconductor device using the highly oriented silicon film, and the three-dimensional semiconductor device manufactured using the above method.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
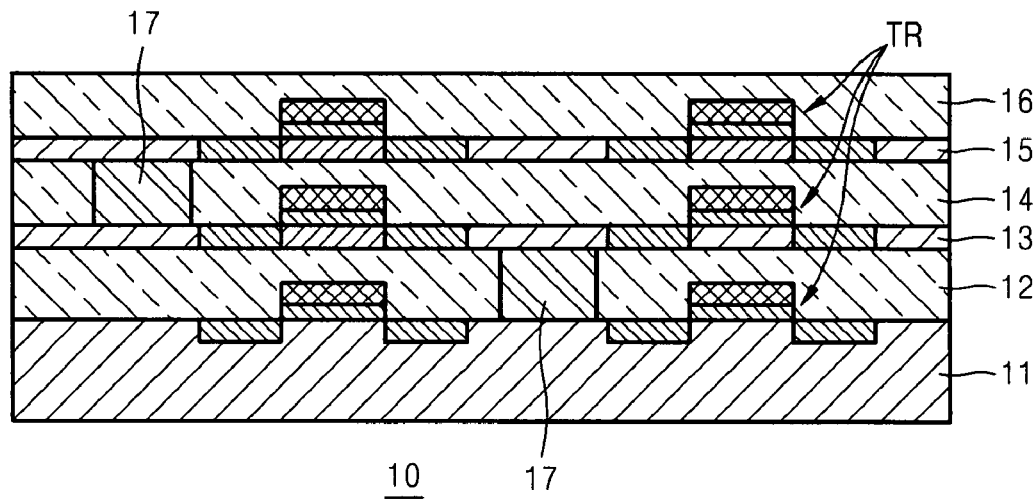
FIG. 1 is a cross-sectional view of a conventional three-dimensional semiconductor device.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elemerits, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Further, as used below to describe example embodiments of the present invention, the term "highly oriented" describes the nature of the referenced layer and includes both layers having relatively small degree of divergence from a given crystallographic plane and layers in which substantially all of the material exhibits the same crystallographic structure. Thus, in an example, if different layers or films are highly oriented with respect to the same crystallographic plane, the different layers may vary, in orientation, by a few degrees in their respective miller index orientations or may include some minor regions exhibiting a different crystallographic structure. The descriptive term "highly oriented" is thereby intended as a relative measure of a layer's adherence to a given crystallographic plane and/or the uniformity of the crystallographic orientation within the referenced film.

Figure 3A:
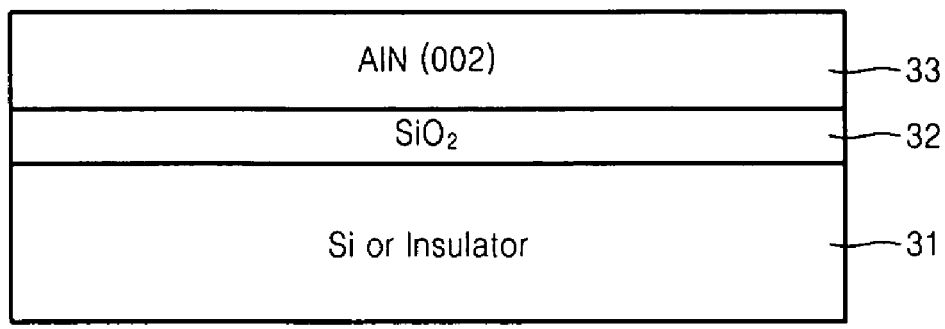
FIGS. 3A through 3C are cross-sectional views illustrating a process of forming a highly oriented silicon film according to an example embodiment of the present invention.
Figure 3B:
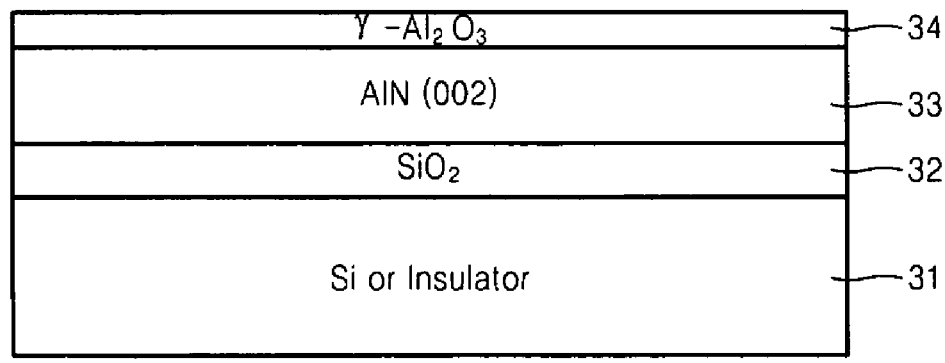
Figure 3C:
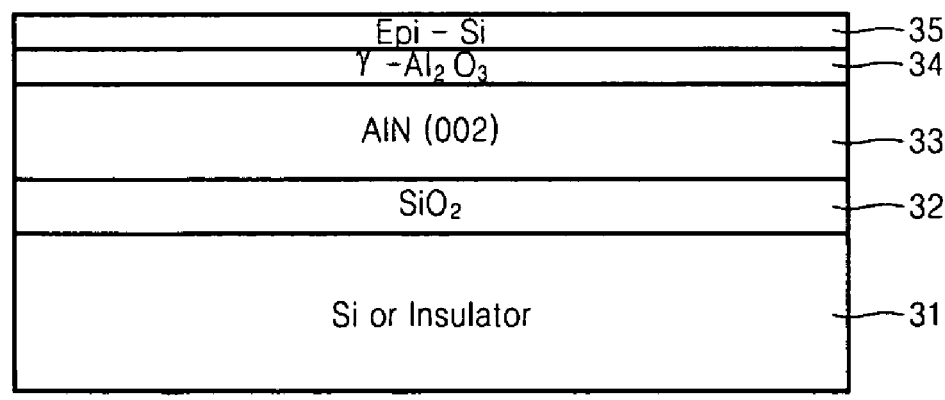

FIGS. 3A through 3C are cross-sectional views illustrating a process of forming a highly oriented silicon film according to an example embodiment of the present invention.

In the example embodiment of FIG. 3A, a $SiO_2$ layer 32 (e.g., an insulating layer) may be formed on a silicon substrate 31, and a highly oriented AlN film 33, oriented in a given direction, may be formed on the $SiO_2$ layer 32. Because the AlN film 33 may be formed on the $SiO_2$ layer 32, it will be appreciated that the $SiO_2$ layer 32 may function as a substrate (e.g., such as substrate 21 in conventional FIG. 1). While the insulating layer 32 is above described and illustrated as including $SiO_2$, it will be appreciated that any well-known insulation material may alternatively be used. For example, the insulating layer 32 may include one or more of $Si_3N_4$ and $Al_2O_3$ in place of or in addition to $SiO_2$, in other example embodiments of the present invention.

In another example embodiment of the present invention, referring to FIG. 3A, the AlN film 33 may be formed by any of a number of processes, including but not limited to a sputtering process, a metalorganic chemical vapor deposition (MOCVD) process, a physical vapor deposition (PVD) process and/or a chemical vapor, deposition (CVD) process. In an example, the AlN film 33 may be formed on the insulating layer 32, which as described above, may include materials such as $SiO_2$, $Si_3N_4$ and/or $Al_2O_3$, such that the AlN film 33 may be substantially uniformly oriented in a direction substantially perpendicular to an upper surface of the substrate 31, or a c-axis.

Figure 4:
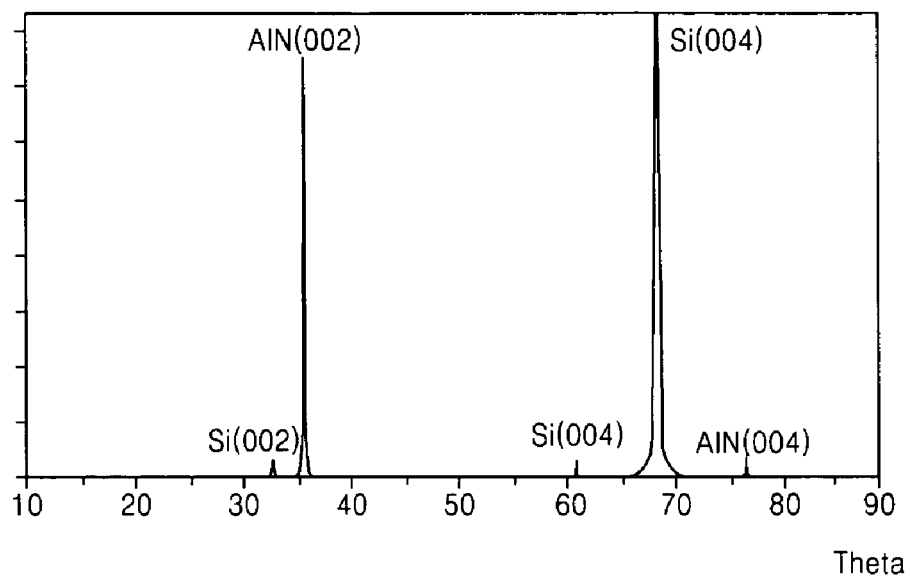
FIG. 4 is a graph illustrating results of X-ray diffraction (XRD) performed on an AlN film according to another example embodiment of the present invention.

FIG. 4 is a graph illustrating results of X-ray diffraction (XRD) performed on the AlN film 33 according to another example embodiment of the present invention. In the example embodiment of FIG. 4, the AlN film 33 may be formed at room temperature using a sputtering method by supplying nitrogen and argon gases at flow rates of 39 sccm and 6 sccm, respectively, with a power supply of approximately 7000 W AC. As shown in the example embodiment of FIG. 4, peaks in <002> and <004> directions are shown because the AlN film 33 may be c-axis oriented. In particular, a relatively large peak may be shown in the <002> direction, which may be indicative of an orientation of the AlN film 33 being substantially oriented in the <002> direction.

In the example embodiments of FIGS. 3 through 4, it will be appreciated that there is no particular limitation of the thickness for the AlN film 33. In an example, the AlN film 33 may be maintained to be a relatively thin layer so as to reduce a size of a three-dimensional semiconductor device. A factor which may contribute to a desired thickness of the AlN film 33 may be a correlation between thickness and orientation uniformity, wherein the orientation of the AlN film 33 may become more uniform as a thickness thereof increases. Accordingly, the thickness of the AlN film 33 may be selected based upon uniformity characteristics as well as size limitations. In an example, the AlN film 33 may have a thickness between about 30 to about 500 nm.

Returning to the process illustrated in the example embodiments of FIGS. 3A to 3C, referring to FIG. 3B, a highly oriented $\gamma$-$Al_2O_3$ layer or $\alpha$-$Al_2O_3$ layer 34 may be formed on a surface of the AlN film 33 by oxidizing the highly oriented AlN film 33. For example, the highly oriented $\gamma$-$Al_2O_3$ layer or $\alpha$-$Al_2O_3$ layer 34 may be formed by thermally oxidizing the highly oriented AlN film 33 at a temperature between about 500 to about 1000° C. in an oxygen or ozone gas atmosphere. In this process, nitrogen may be reduced or removed from the surface of the AlN film 33, and $Al_2O_3$ may be formed by combining oxygen with aluminum. Based on heating time and temperature used in the above-described process, a $\gamma$-$Al_2O_3$ layer or, an $\alpha$-$Al_2O_3$ layer or a mixed layer comprised of $\gamma$-$Al_2O_3$ and $\alpha$-$Al_2O_3$ may be formed. In an example, any of the $Al_2O_3$ layers formed in the above-described manner may be crystals having a shorter-range order, and may be oriented in the c-axis direction so as to be substantially perpendicular to an upper surface of the substrate 31 similar to the AlN film 33. For example, one or more of the $Al_2O_3$ may be $\gamma$-$Al_2O_3$ and/or $\alpha$-$Al_2O_3$ may be oriented in the <001>direction.

Figure 2:
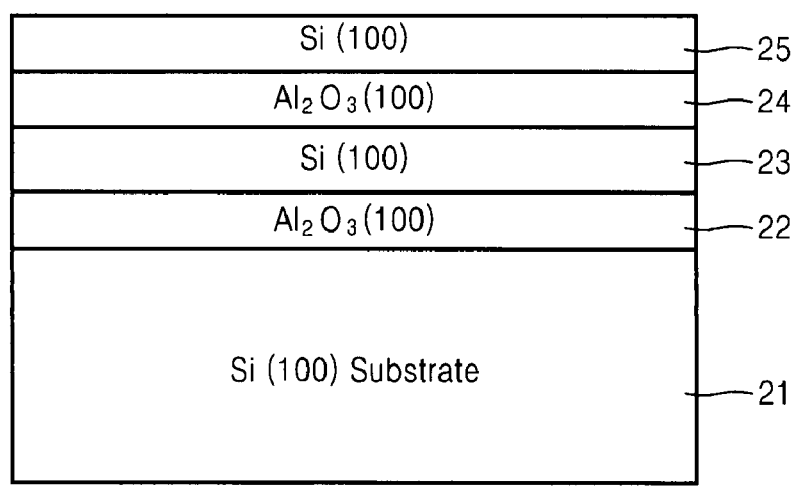
FIG. 2 is a cross-sectional view illustrating a conventional structure used to form a highly oriented silicon film.

In the example embodiment of FIG. 3B, after the highly oriented $\gamma$-$Al_2O_3$ layer and/or $\alpha$-$Al_2O_3$ layer 34 is formed on the highly oriented AlN film 33, a surface of the highly oriented $\gamma$-$Al_2O_3$ layer and/or $\alpha$-$Al_2O_3$ layer 34 may be washed using, for example, a diluted hydrogen fluoride (HF) solution to reduce or remove, remaining impurities from the surface. not be highly oriented. Accordingly, the conventional stacking structure of FIG. 2 may typically not be deployed during a fabrication of semiconductor devices.

SUMMARY OF THE INVENTION

An example embodiment of the present invention is directed to a method of forming a semiconductor device, including forming a first layer on a substrate, the first layer including aluminum nitride (AlN), forming a second layer by oxidizing a surface of the first layer and forming a third layer on the second layer, the first, second and third layers each being highly oriented with respect to one of a plurality crystallographic planes.

Another example embodiment of the present invention is directed to a semiconductor device, including a substrate including a first layer, the first layer including aluminum nitride (AlN), a second layer formed by oxidizing a surface of the first layer and a third layer formed on the second layer, the first, second and third layers each being highly oriented with respect to one of a plurality crystallographic planes.

Another example embodiment of the present invention is directed to a method of forming a highly oriented silicon film, including forming an aluminum nitride (AlN) layer on a substrate, oxidizing a surface of the AlN layer to form an Al2O3 layer, the Al2O3 layer being highly oriented with respect to one of a plurality of crystallographic planes and growing a highly oriented silicon layer on the Al2O3 layer.

Other example embodiments of the present invention are directed to a method of forming a highly oriented silicon film. In an example, the method may be performed at lower temperatures, and may be compatible with conventional semiconductor manufacturing processes, such that an orientation of the silicon film may be more effectively controlled.

Other example embodiments of the present invention are directed to a method of manufacturing a three-dimensional semiconductor device using the highly oriented silicon film, and the three-dimensional semiconductor device manufactured using the above method.

BRIEF DESCRIPTION OF THE DRAWINGS

The accompanying drawings are included to provide a further understanding of the invention, and are incorporated in and constitute a part of this specification.

Figure 5:
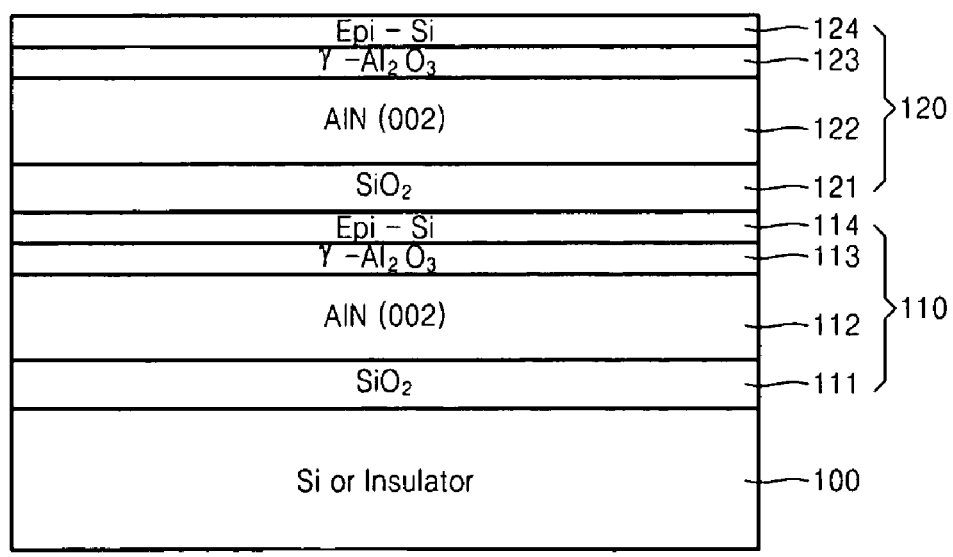
FIG. 5 is a cross-sectional view illustrating a stacking structure of a plurality of highly oriented silicon films according to another example embodiment of the present invention.

In the example embodiment of FIG. 5, a second multilayer 120 may include a $SiO_2$ layer 121, a highly oriented AlN film 122, a highly oriented $\gamma$-$Al_2O_3$ layer 123 and a highly oriented silicon film 124. The second multilayer 120 may be formed on the highly oriented silicon film 114. Although not explicitly illustrated in FIG. 5, additional multilayers may be stacked on the silicon film 124 in a manner similar to that of the second multilayer 120 on the first multilayer 110.

In another example embodiment of the present invention, a three-dimensional semiconductor device, functionally equivalent to the device illustrated in FIG. 1, may be manufactured by forming thin film transistors, such as CMOS devices or electronic devices such as memory devices, on upper surfaces of the silicon substrate 100 and the highly oriented silicon films 114 and 124 as shown in the example embodiment of FIG. 5. Further, an electronic device, such as a thin film transistor or a memory, may be formed on the silicon substrate 100 by forming a gate insulating layer (not shown) and a gate electrode (not shown) between two doped regions, which may be formed by doping an n-dopant and a p-dopant on given regions of the silicon substrate 100 (e.g., with any well-known doping process). The $SiO_2$ layer 111, the highly oriented AlN film 112, the highly oriented $\gamma$-$Al_2O_3$ layer 113 and the highly oriented silicon film 114 may be sequentially formed on the silicon substrate 100. Thus, an electronic device, such as a thin film transistor or a memory, may be formed on an upper surface of the highly oriented silicon film 114 using the above process, which may thereby form the three-dimensional semiconductor device (e.g., if performed repeatedly).

In another example embodiment of the present invention, a highly oriented silicon film may be formed on an insulating layer by forming a buffer layer including AlN. Furthermore, the highly oriented silicon film according to the present invention may be manufactured using a lower temperature process and also employing a process which may be compatible with conventional manufacturing processes. Accordingly, manufacture of a three-dimensional semiconductor device according to example embodiments of the present invention may be associated with lower costs and a simpler process (e.g., because lower temperatures may be used) as compared to conventional fabrication processes.

In another example embodiment of the present invention, a highly oriented silicon film may be formed by forming a buffer layer including aluminum nitride (AlN) on an insulating layer.

Example embodiments of the present invention being thus described, it will be obvious that the same may be varied in many ways. For example, while the example embodiments are above described as being related to epitaxial growing silicon film, it is understood that other example embodiments of the present invention need not be limited to a "silicon" film. For example, other example embodiments of the present invention may deploy one or more semiconductor films, in place of or in addition to the silicon film, such as GaN, $Fe_3O_4$, etc.

Likewise, the compositions of the particular layers have been above-described and illustrated as including particular compositions. For example, the substrate 31 is above described as including silicon, whereas other example embodiments may include any well-known substrates, and need not be limited to "silicon" substrates. Similarly, in another example, the $\gamma$-$Al_2O_3$ layer or $\alpha$-$Al_2O_3$ layer 34 and the $SiO_2$ layer 32 may each be configured to include other materials in addition to or in place of the particular compositions given above for example purposes.

Such variations are not to be regarded as a departure from the spirit and scope of example embodiments of the present invention, and all such modifications as would be obvious to one skilled in the art are intended to be included within the scope of the following claims.

What is claimed is:

1. A method of forming a semiconductor device, comprising:
    forming a first layer on a substrate, the first layer including aluminum nitride (AlN);
    forming a second layer on the first layer by oxidizing a surface of the first layer, wherein the second layer is oriented in the <100> direction and perpendicular to an upper surface of the substrate; and
    forming a third layer on the second layer to form a stacked structure including the first AlN layer, the second layer and the third layer, the first, second and third layers each being highly oriented with respect to one another.

2. The method of claim 1, wherein the second layer includes $Al_2O_3$.

3. The method of claim 1, wherein the third layer includes silicon.

4. The method of claim 1, wherein the substrate includes at least one insulating material selected from the group consisting of Si, $SiO_2$, $Si_3N_4$, and $Al_2O_3$.

5. The method of claim 1, wherein the first layer is oriented in a c-axis direction on the substrate.

6. The method of claim 5, wherein the first layer is oriented with a miller index direction substantially equal to [0, 0, 2].

7. The method of claim 1, wherein the first layer is formed using one of a sputtering process, a metal-organic chemical vapor deposition (MOCVD) process, a physical vapor deposition (PVD) process and a chemical vapor deposition (CVD) process.

8. The method of claim 1, wherein oxidizing the surface of the first layer includes thermal oxidation of the first layer in an oxygen or ozone gas atmosphere.

9. The method of claim 8, wherein the thermal oxidation is performed at a temperature between about 500° C. to about 1000° C.

10. The method of claim 1, wherein the second layer includes one of a $\gamma$-$Al_2O_3$ structure, an $\alpha$-$Al_2O_3$ structure and a mixed structure including both the $\gamma$-$Al_2O_3$ and $\alpha$-$Al_2O_3$ structures.

11. The method of claim 1, wherein the second layer is oriented with a miller index direction substantially equal to [0, 0, 1].

12. The method of claim 1, further comprising:
    washing a surface of the second layer before forming the third layer.

13. The method of claim 12, wherein the washing of the surface of the second layer is performed using a diluted hydrogen fluoride (HF) solution.

14. The method of claim 1, wherein forming the third layer includes the use of one or more of an ultra-high vacuum chemical vapor deposition (UHV CVD) process, a low pressure chemical vapor deposition (LPCVD) process and a molecular beam epitaxy (MBE) process.

15. The method of claim 1, wherein the third layer is oriented with a miller index direction substantially equal to [0, 0, 1].

16. The method of claim 1, further comprising:
    forming an electronic device on the third layer.

17. The method of claim 1, further comprising:
    forming a fourth layer on the substrate, the substrate including a first electronic device,
    wherein the first layer is formed on the fourth layer such that the first layer is indirectly on the substrate.

18. The method of claim 17, further comprising:
    forming a second electronic device on the third layer.

19. The method of claim 18, wherein the first through fourth layers and the second electronic device collectively constitute a first multiplayer.

20. The method of claim 19, further comprising:
    forming at least one additional multilayer on the first multilayer by repeating the steps of forming the first through fourth layers; wherein the forming of the second electronic device includes stacking the first multilayer and the at least one additional multilayer.

21. The method of claim 17, wherein the fourth layer is an interlayer insulating layer including one or more of $SiO_2$, $Si_3N_4$ and $Al_2O_3$.

22. A semiconductor device manufactured using the method of claim 1.

23. A method of forming a highly oriented silicon film, comprising:
    forming an aluminum nitride (AlN) layer on a substrate;
    oxidizing a surface of the AlN layer to form an $Al_2O_3$ layer on the AlN layer, the $Al_2O_3$ layer being highly oriented with respect to the AlN layer, and the $Al_2O_3$ layer being oriented in the <100> direction and perpendicular to an upper surface of the substrate; and
    growing a highly oriented silicon layer on the $Al_2O_3$ layer to form a stacked structure including the AlN layer, the $Al_2O_3$ layer, and the highly oriented silicon layer.

24. The method of claim 23, wherein the substrate includes $Si_3N_4$.

25. The method of claim 23, wherein the oxidizing of the surface of the AlN layer includes thermal oxidation of the AlN layer in an ozone gas atmosphere.

* * * * *